United States Patent
Wang et al.

(10) Patent No.: US 9,589,764 B2
(45) Date of Patent: Mar. 7, 2017

(54) ELECTRON BEAM LITHOGRAPHY PROCESS WITH MULTIPLE COLUMNS

(71) Applicant: Taiwan Semiconductor Manufacturing Company, Ltd., Hsin-Chu (TW)

(72) Inventors: Wen-Chuan Wang, Hsinchu (TW); Shy-Jay Lin, Hsinchu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/695,617

(22) Filed: Apr. 24, 2015

(65) Prior Publication Data

US 2016/0284504 A1    Sep. 29, 2016

Related U.S. Application Data

(60) Provisional application No. 62/139,316, filed on Mar. 27, 2015.

(51) Int. Cl.
  *G21K 5/04* (2006.01)
  *H01J 37/26* (2006.01)
  *H01J 37/147* (2006.01)
  *H01J 37/317* (2006.01)

(52) U.S. Cl.
  CPC ...... *H01J 37/1474* (2013.01); *H01J 37/3174* (2013.01); *H01J 2237/063* (2013.01)

(58) Field of Classification Search
  USPC ......... 250/396 R, 397, 492.1, 492.2, 492.21, 250/492.22, 492.23, 492.3
  See application file for complete search history.

(56) References Cited

U.S. PATENT DOCUMENTS

| | | |
|---|---|---|
| 6,124,599 A | 9/2000 | Muraki |
| 8,368,037 B2 * | 2/2013 | Wang ............... B82Y 10/00 250/310 |
| 8,464,186 B2 | 6/2013 | Wang et al. |
| 8,468,473 B1 | 6/2013 | Wang et al. |
| 8,473,877 B2 | 6/2013 | Wang et al. |
| 8,507,159 B2 | 8/2013 | Wang et al. |
| 8,510,687 B1 | 8/2013 | Liu et al. |
| 8,524,427 B2 | 9/2013 | Shin et al. |
| 8,530,121 B2 | 9/2013 | Wang et al. |
| 8,563,224 B1 | 10/2013 | Chen et al. |

(Continued)

FOREIGN PATENT DOCUMENTS

| JP | 2005286346 A | 10/2005 |
|---|---|---|
| JP | 5368086 | 12/2013 |

*Primary Examiner* — Nicole Ippolito
(74) *Attorney, Agent, or Firm* — Haynes and Boone, LLP

(57) ABSTRACT

The present disclosure provides methods of electron-beam (e-beam) lithography process. The method includes loading a substrate to an electron-beam (e-beam) system such that a first subset of fields defined on the substrate is arrayed on the substrate along a first direction. The method also includes positioning a plurality of e-beam columns having a first subset of e-beam columns arrayed along the first direction. The e-beam columns of the first subset of e-beam columns are directed to different ones of the first subset of fields. The method also includes performing a first exposing process in a scan mode such that the plurality of e-beam columns scans the substrate along the first direction.

20 Claims, 18 Drawing Sheets

(56) References Cited

U.S. PATENT DOCUMENTS

| | | | |
|---|---|---|---|
| 8,584,057 | B2 | 11/2013 | Liu et al. |
| 8,601,407 | B2 | 12/2013 | Wang et al. |
| 8,609,308 | B1 | 12/2013 | Chen et al. |
| 8,627,241 | B2 | 1/2014 | Wang et al. |
| 8,677,511 | B2 | 3/2014 | Wang et al. |
| 8,762,900 | B2 | 6/2014 | Shin et al. |
| 8,822,106 | B2 | 9/2014 | Wang et al. |
| 8,828,632 | B2 | 9/2014 | Wang et al. |
| 8,835,082 | B2 | 9/2014 | Chen et al. |
| 8,841,049 | B2 | 9/2014 | Wang et al. |
| 8,846,278 | B2 | 9/2014 | Shin et al. |
| 2010/0019172 | A1 | 1/2010 | Yamada et al. |
| 2015/0044614 | A1* | 2/2015 | Sentoku .............. H01J 37/3045 430/296 |

* cited by examiner

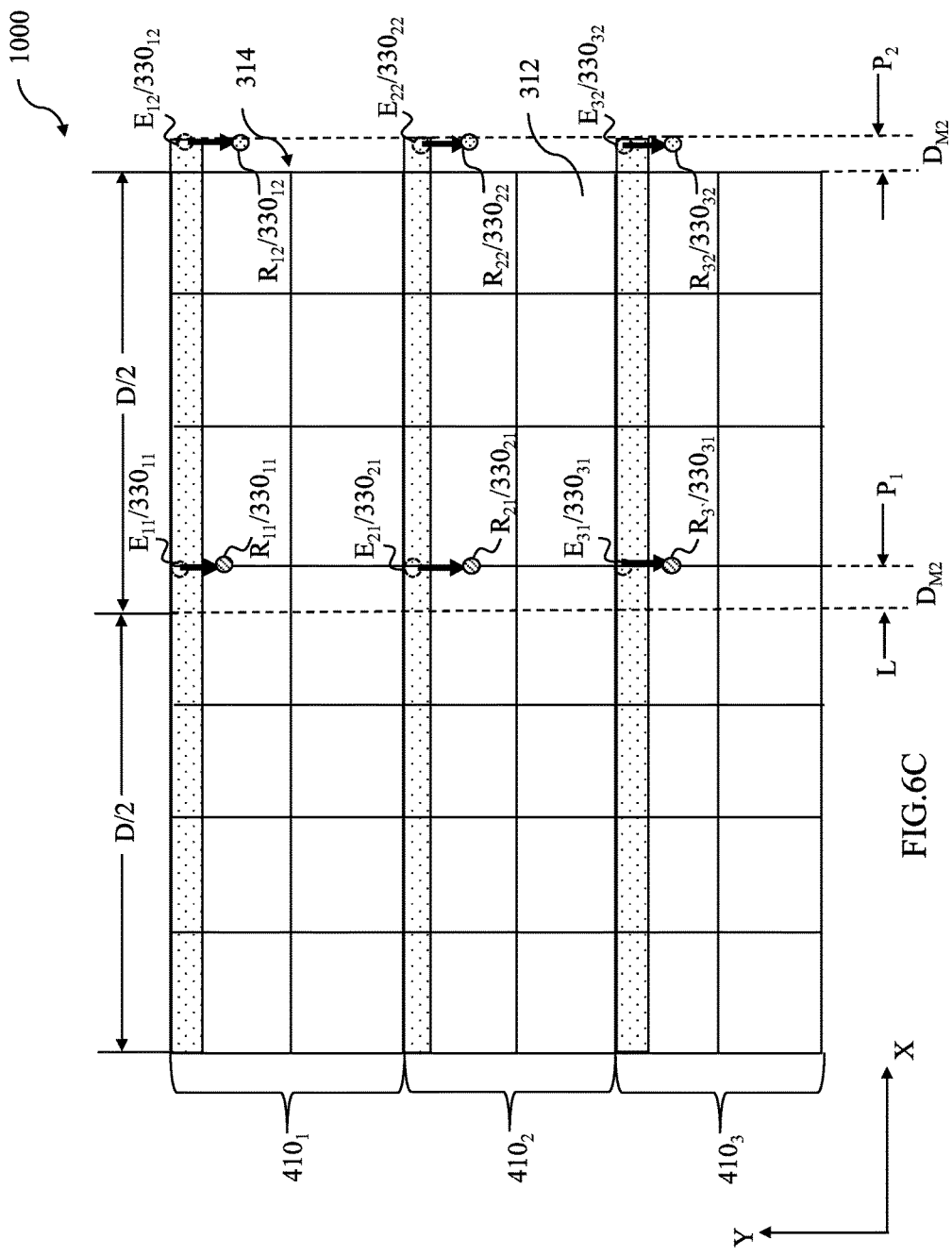

ELECTRON BEAM LITHOGRAPHY PROCESS WITH MULTIPLE COLUMNS

CROSS-REFERENCE

This application claims the benefit of U.S. Provisional Patent Application Ser. No. 62/139,316, filed on Mar. 27, 2015, the entire disclosure of which is hereby incorporated herein by reference.

BACKGROUND

Semiconductor integrated circuit (IC) fabrication involves forming multiple material layers with designed patterns on a semiconductor wafer. Those patterned material layers on the semiconductor wafer are aligned and configured to form one or more functional circuits. Photolithography systems are used to pattern a semiconductor wafer. When semiconductor technology continues progressing to circuit layouts having smaller feature sizes, a lithography system with higher resolution is need to image an IC pattern with smaller feature sizes. An electron-beam (e-beam) system is introduced for lithography patterning processes as the electron beam has wavelengths that can be tuned to very short, resulting in very high resolution. Although existing methods of lithography processes have been generally adequate for their intended purposes, they have not been entirely satisfactory in all respects. For example, challenges rise to reduce e-beam writing time and increase throughput. Improvements in this area are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

FIGS. 4, 5A-5D, 6A-6E and 7A-7E are schematic top views of lithography process in accordance with some embodiments.

DETAILED DESCRIPTION

Figure 1:
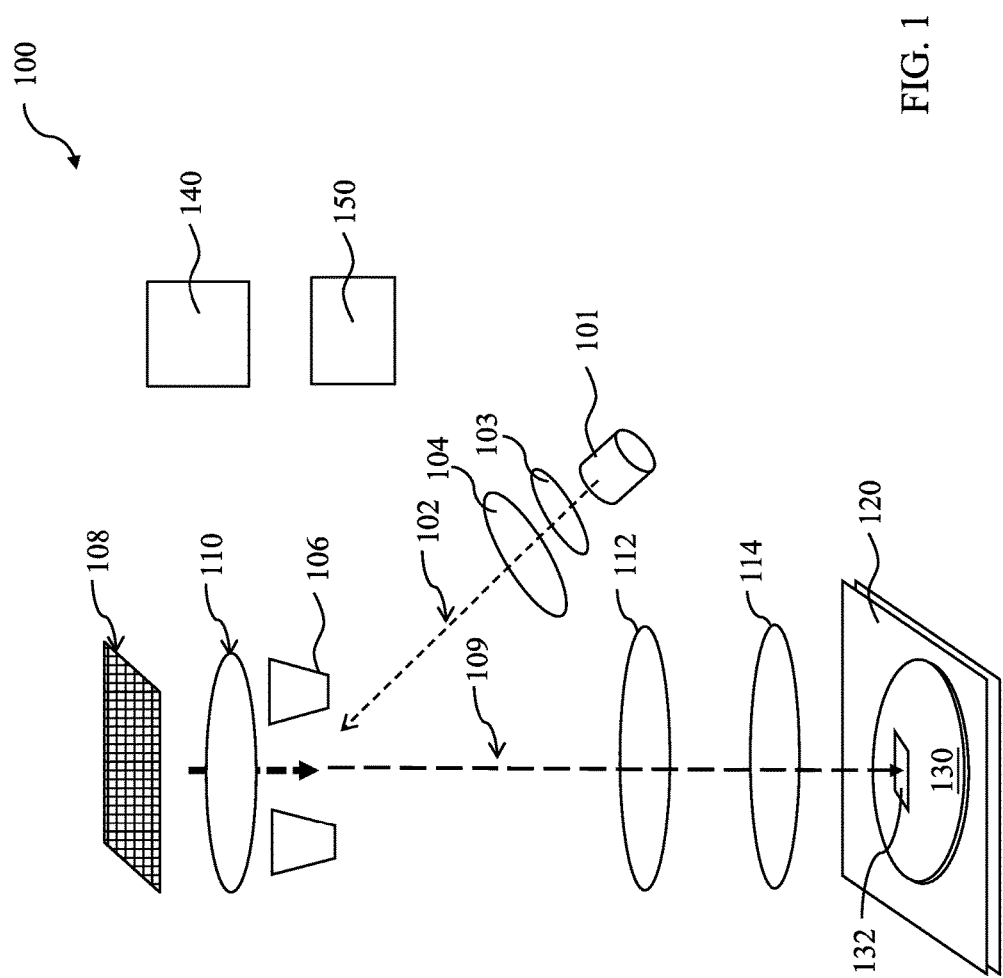
FIG. 1 is a diagrammatic view of one embodiment of an electron-beam (e-beam) lithography system for integrated circuit (IC) patterning constructed according to aspects of the present disclosure.

The present disclosure relates generally to lithography systems and a method of utilizing such systems. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 illustrates a schematic view of an electron-beam (or e-beam) column 100 constructed in accordance with some embodiments of the present disclosure. The e-beam column 100 is an electron-based lithography technique that utilizes an electron-based imaging for various integrated circuits (IC) patterning. The electron-beam column 100 transfers an IC design pattern to an e-beam sensitive resist (e-beam-resist or resist) layer coated on a substrate, such as a semiconductor wafer. The e-beam column 100 provides a higher imaging resolution than that of an optical lithography because an electron beam can be energized to have a shorter wavelength.

The e-beam column 100 includes an electron source 101 to provide an electron beam 102. In furtherance of the embodiment, the electron source 102 is an electron gun with a mechanism to generate electrons, such as by thermal electron emission. In a particular example, the electron gun includes a tungsten (or other suitable material) filament designed and biased to thermally emit electrons. In some embodiments, the e-beam 102 from the e-beam source 101 is a continuous e-beam with constant beam intensity over time.

The e-beam column 100 may further include e-beam lens (gun lens) 103 configured in the front of the e-beam source 101 to control the e-beam 102. The e-beam lens 103 controls the e-beam 102 to have a proper direction and/or a beam size. In one embodiment, the e-beam lens 103 may tune the e-beam 102 from the e-beam source 101 to have a large spot with a uniform space distribution. In another embodiment, the e-beam 102 may be further processed to have a proper beam spot and uniformity by other electron lenses.

The e-beam column 100 further includes an alignment gate 104 designed to modulate the e-beam 102 in terms of intensity, such as a beam intensity periodically changing over time. The alignment gate 104 includes a proper mechanism to modulate the e-beam 102 to form the alternating e-beam. In one embodiment, the alignment gate 104 includes a mechanism to modulate the e-beam 102 through an electrical field. In another embodiment, the alignment gate 104 includes a mechanism to modulate the e-beam 102 through a material layer with a dynamically controllable transmission to the e-beam 102. In other embodiment, the alignment gate 104 includes any suitable mechanism to effectively and dynamically control the intensity of the e-beam 102 over time. The e-beam column 100 further includes other components synchronize the alignment gate 104 with a digital pattern generator (DPG), which will be described later.

The e-beam column 100 may include a deflector 106 to deflect an electron beam for scanning and exposing a certain region of a substrate in a certain mode, such as raster mode.

The e-beam column 100 may also include a DPG 108 to generate a patterned e-beam array 109. The DPG 108 is a structure that includes a plurality of pixels configured in an array. The DPG 108 also includes a mechanism to enable individual pixel to toggle between on and off states. When a pixel is on, the pixel reflects the e-beam 102 (or a portion of the e-beam 102) projected on that pixel. When a pixel is off, the pixel does not reflect the e-beam 102 (or a portion of the e-beam 102) projected on that pixel. In one embodiment, the DPG 108 includes an integrated circuit (IC) based chip having an array of pixels controllable by a built-in drive circuit. In furtherance of the embodiment, the DPG 108 may include an IC chip with technologies such as complimentary metal-oxide-semiconductor filed effect transistor (CMOS-FET), or fin-type filed effect transistor (FinFET).

The e-beam column 100 may also include a DPG lens 110 and other lens features, such as an upper demagnification lens 112 and a lower demagnification lens 114 properly configured for proper imaging effects.

The e-beam column 100 also includes a wafer stage 120 to secure a wafer 130. In the present embodiment, the wafer 130 is coated with a resist layer to be patterned in a lithography process by the e-beam lithography system 100. The resist layer includes a resist material sensitive to electrons (so also referred to as e-beam resist). The resist material includes a component that resist to an IC fabrication process, such as etch and/or ion implantation. The resist material further includes a component sensitive to electrons. The resist material may be negative tone or positive tone. In one example, the resist material includes polymethyl methacrylate (PMMA).

In one embodiment, the wafer stage 120 is operable to move such that an e-beam is directed to various locations of the resist layer on the wafer 130. In one example, the wafer stage 120 and the deflector 106 are designed to coordinately move the e-beam(s) relative to the wafer 130. Particularly, in the present embodiment, the wafer 130 includes a plurality of regions (fields) 132 to be patterned. Each field 132 will be patterned with a same IC pattern and each field 132 has identical dimension, area and shape.

The e-beam column 100 also includes an electric signal generator 140 and an IC design database 150 integrated and coupled with various components of the e-beam column 100. The patterned e-beam array 109 can be switched on and off by the electric signal (data) sent by the electric signal generator 140, according to the IC design database 150. The IC design database 150 includes an IC design layout. In some embodiments, an IC design layout includes one or more IC design features or patterns. The IC design may define a device such as a static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof. The IC design layout is presented in one or more data files having the information of geometrical patterns. In some examples, the IC design layout may be expressed in a graphic database system (GDS) format.

The data may be stored and/or sent as a computer file, for example, as a graphic database system (GDS) type file, as an open artwork system interchange standard (OASIS) type file, and/or as any appropriate type file. The GDS or OASIS files are database files used for data exchange of IC layout artwork. For example, these files may have binary file formats for representing planar geometric shapes, text labels, as well as other layout information of the IC layout. The GDS or OASIS files may each contain multiple layers. The GDS or OASIS files may be used to reconstruct the IC layout artwork, and as such can be transferred or shared between various fabrication tools including the e-beam column 100.

The e-beam column 100 may further include other components and modules. In one example, the e-beam column 100 includes a module to check and monitor alignment and overlay during a lithography exposure process.

Figure 2:
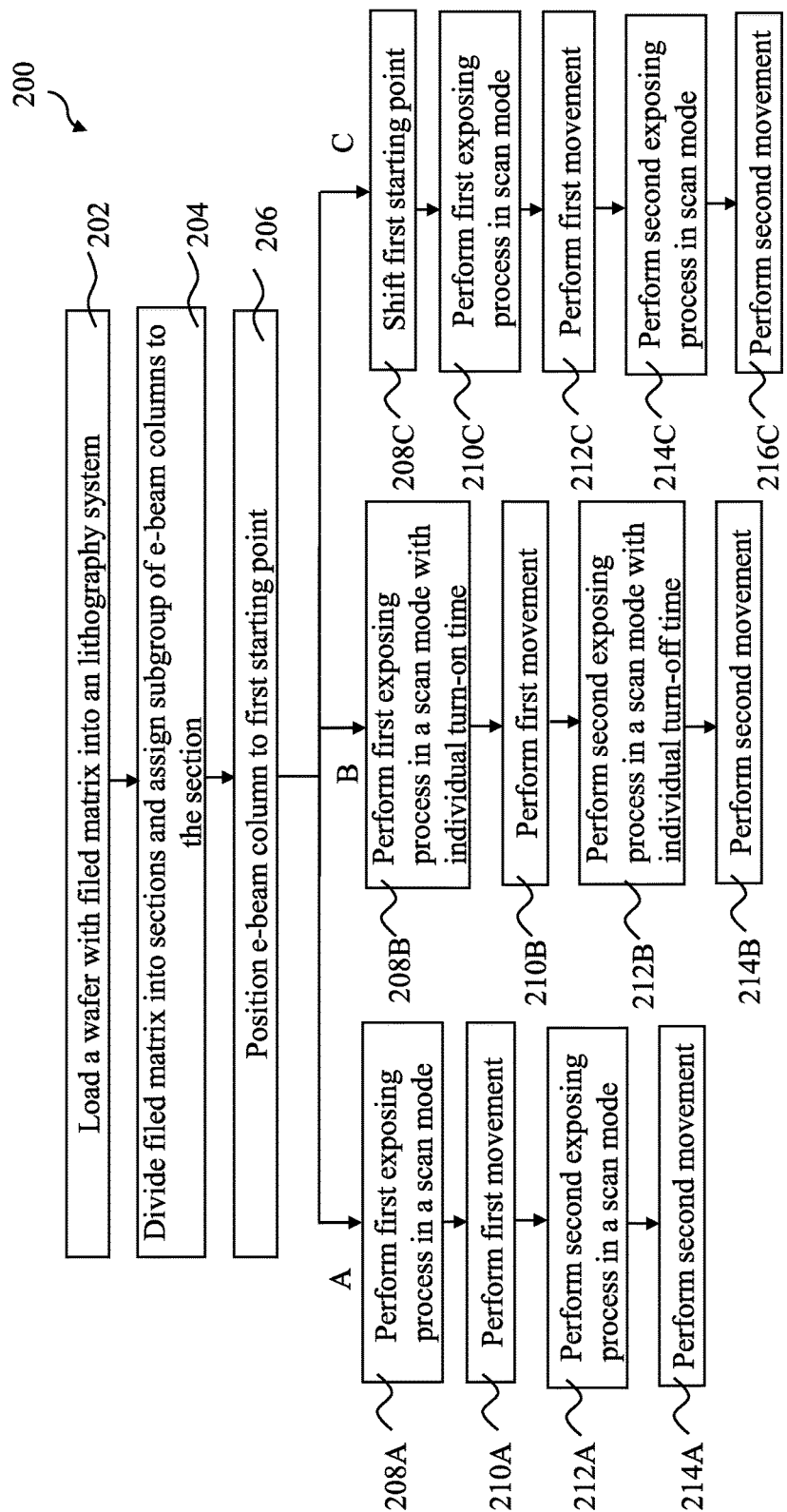
FIG. 2 is a flowchart of a method of an example for an lithography process in accordance with some embodiments.

FIG. 2 is a flowchart illustrating a method 200 of a lithography process 1000 on a substrate, such as the wafer 130, using lithography system, such as e-beam column 100. It is understood that additional steps can be provided before, during, and after the method 200, and some steps described can be replaced, eliminated, or moved around for additional embodiments of the method 200.

Figure 3:
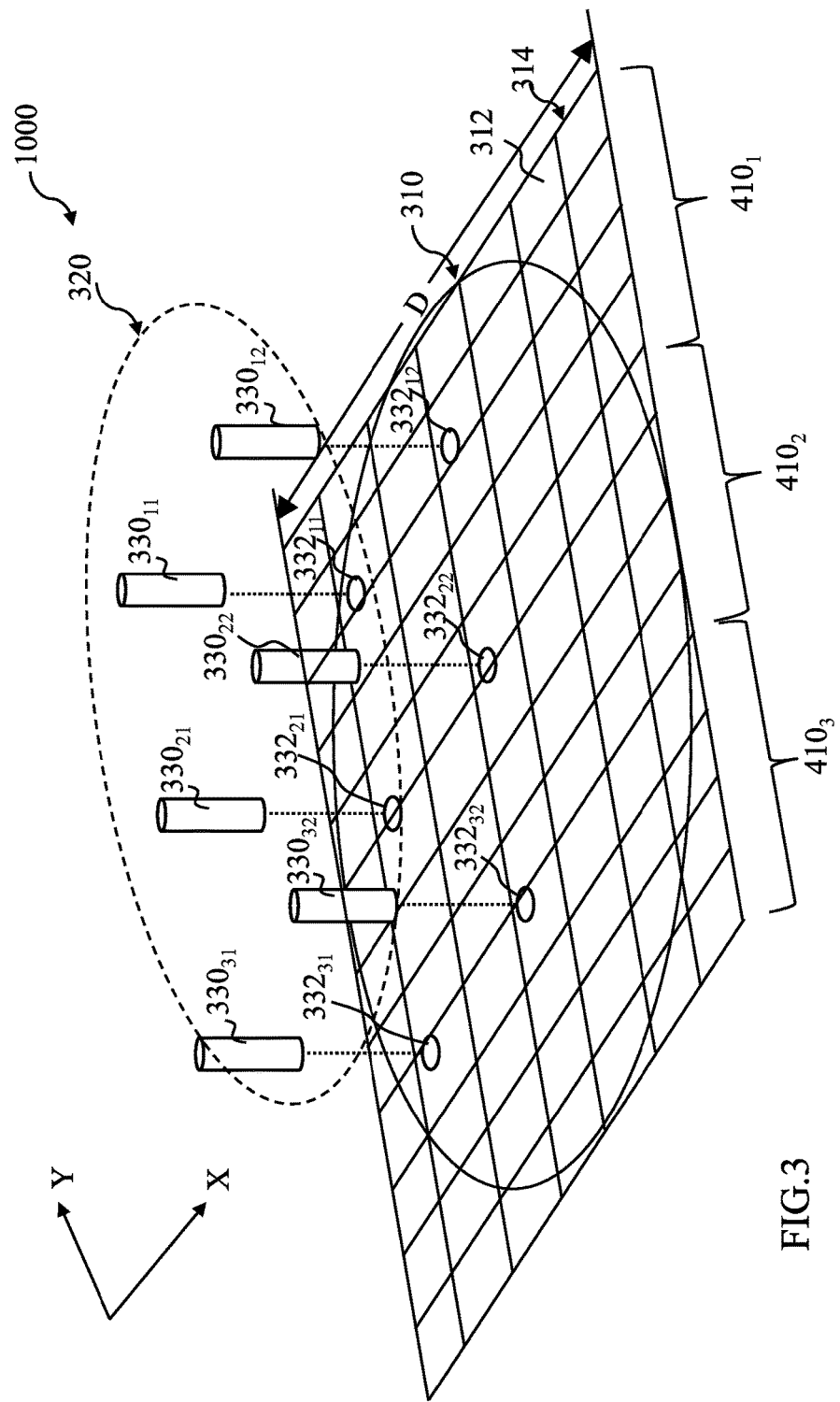
FIG. 3 is a schematic view of a lithography process in accordance with some embodiments.

Referring to FIGS. 2 and 3, the method 200 starts at step 202 by loading a wafer 310 coated with a resist layer to an electron-beam (e-beam) system 320. The wafer 310 may be substantially similar to the wafer 130 described above with reference to FIG. 1. The resist layer is deposited over the wafer 310, for example, by a spin-on coating technique. The resist layer may be subjected to a baking process, such as a soft baking process (also referred to as a pre-exposure bake process).

The wafer 310 is divided into a plurality of fields 312 to form a field matrix 314 for subsequent operations. In one embodiment, the field matrix 314 has a width (along the X-direction) which is equal to the diameter D of the wafer 310. The field 312 may be substantially similar to the field 132 described above with reference to FIG. 1. Fields 312 align up in a number of rows and columns. In the present example, the field 312 is in a rectangle shape or a square shape. A total number of fields 312 may be determined according to one or more factors, such as calculation efficiency. When the total number is large, the operations in the following process may take a longer time to complete. When the total number is small, the operations in the following process may take less time to complete, but may result in reduced optimization effectiveness. Accordingly, the total number is properly chosen according to one or more factors, such as engineer experience and/or previous processed data (such as historic data collected from execution of the method 200).

In the present embodiment, the e-beam system 320 includes a plurality of e-beam columns 330. The e-beam column 330 may be substantially similar to the e-beam column 100 described above with reference to FIG. 1. The multiple e-beam columns 330 are aligned such that each e-beam column 330 impacts the field 312 at precise focal points 332 (point in the field not field in the point) (enlarged for clarity). The focal points 332 are scanned along the surface of the wafer 310 by moving the e-beam columns 330 and/or by moving the wafer 310.

Referring also to FIGS. 2 and 3, the method 200 proceeds to step 204 by dividing the field matrix 314 into multiple sections along a Y-direction, which is perpendicular to an e-beam scan direction (X-direction) and assigning a subgroup of e-beam columns 330 to each sections. In the present embodiment, the field matrix 314 has M sections $410_M$ (where M is integer), such as $410_1$, $410_2$ and $410_3$, as shown in FIG. 3. Each section $410_M$ has N of the e-beam columns 330 (where N is integer). An e-beam column $330_{MN}$ represents a $N^{th}$ e-beam column 330 in of $M^{th}$ section, such as $330_{11}$ and $330_{12}$ in the section $410_1$, and so forth. In some embodiments, the field matrix 314 is divided such that no field 312 is divided into two adjacent sections. The total number of sections $410_M$, M, and total number of e-beam column 330 in each section $410_M$, N, may be determined according to one or more factors, such as time consuming of the wafer stage acceleration/deceleration, process complexity and process efficiency.

As one example, as shown in FIG. 3, (where the M=3 and N=2), the field matrix 314 is divided into sections of $410_1$, $410_2$ and $410_3$ and the e-beam columns $330_{11}$ and $330_{12}$ are assigned to section $410_1$; the e-beam columns $330_{21}$ and $330_{22}$ are assigned to section $410_2$ and the e-beam columns $330_{31}$ and $330_{32}$ are assigned to section $410_3$.

Figure 4:
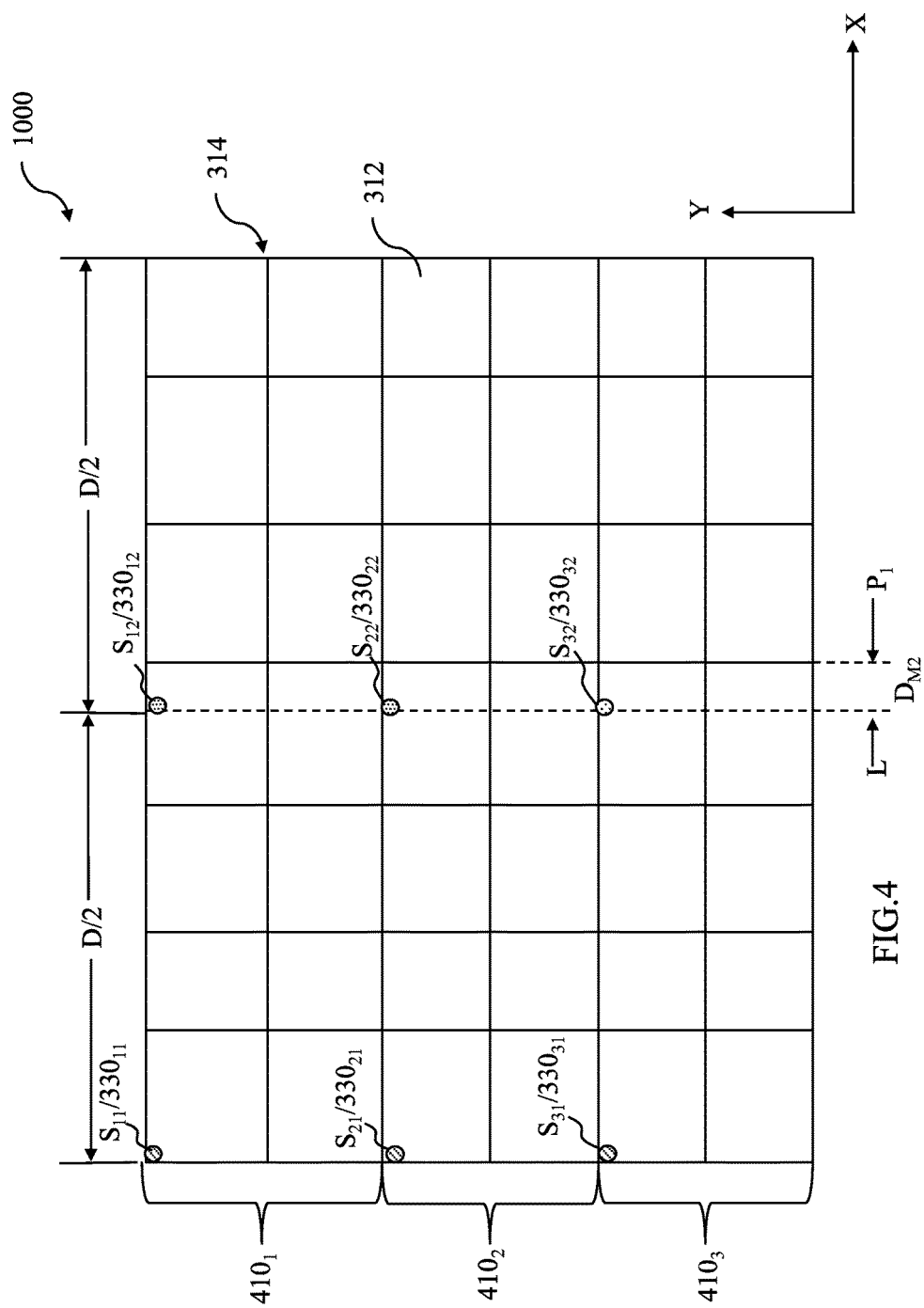

Referring to FIGS. 2 and 4, the method 200 proceeds to step 206 by positioning the e-beam column $330_{MN}$ arrayed along the first direction (X-direction) such that e-beams of the e-beam columns $330_{MN}$ are directed to a first starting point $S_{MN}$ on the field matrix 314. In the present embodiment, the e-beam column $330_{M1}$ is positioned to the first starting point $S_{M1}$. The e-beam column $330_{MN}$ (except $330_{M1}$) is positioned to the first starting point $S_{MN}$ (except $S_{M1}$), arrayed along the X-direction, at $X_{MN}=(N-1)$ D/N, where $X_{MN}$ represents a location of the first starting point of the e-beam column $330_{MN}$ along the X direction. As an example, as shown in FIG. 4, the filed matrix 314 is divided into three sections and the each section has two e-beam columns. The e-beam columns $330_{11}$ is positioned to the first starting point $S_{11}$, the e-beam columns $330_{12}$ is positioned to the first starting point $S_{12}$ having X=D/2, represent by a line L in the field matrix 314, and so forth.

In some embodiments, the first starting point $S_{MN}$ may not be at a similar location at the corresponding field 312 of the second $410_M$ and has a distance $D_{MN}$ away (along forward direction of the X-direction, which will be the direction of scan) from the most adjacent similar location at the corresponding field 312, where $D_{MN}$ represents the distance for $N^{th}$ e-beam column 330 in the $M^{th}$ section. As an example, as shown in FIG. 4, the first starting point $S_{M1}$ is at the edge of the field 312 while the first starting point $S_{M2}$ is at the line L, which has the distance $D_{M2}$ to the most adjacent edge of field 312 (represent by a line $P_1$) along the scan direction.

The method 200 has three paths after step 206, identified by the suffix "A", "B" and "C", respectively. These three paths are separately discussed below. The present disclosure repeats reference numerals and/or letters in the various embodiments. This repetition is for the purpose of simplicity and clarity such that repeated reference numerals and/or letters indicate similar features amongst the various embodiments unless stated otherwise.

Figure 5A:
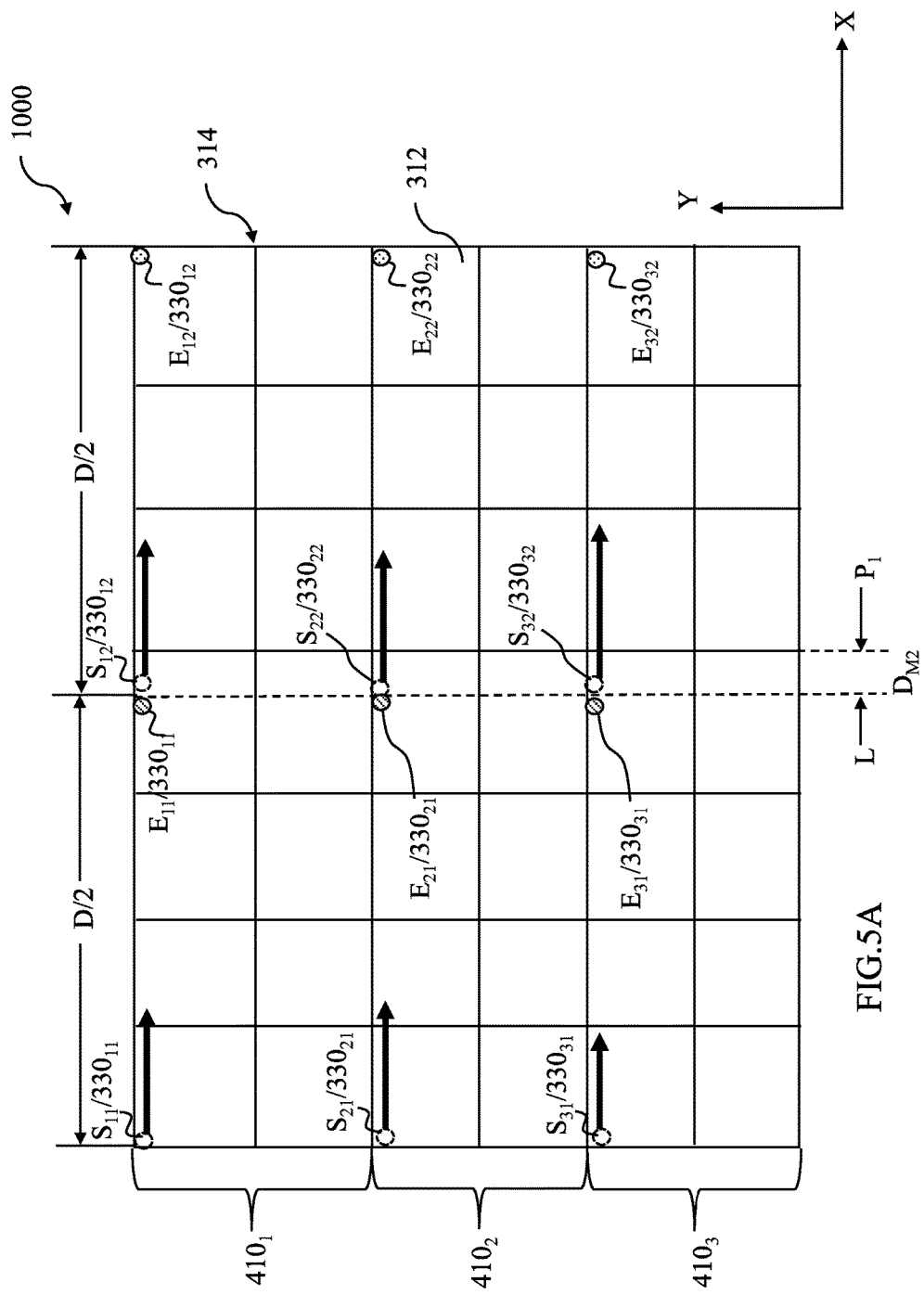

Referring to FIGS. 2 and 5A, for the path A, the method 200 proceeds to step 208A by performing a first exposing process in a scan mode to the field matrix 314 simultaneously by each of e-beam column $330_{MN}$ along X-direction (as shown in arrow in FIG. 5A). The e-beam $330_{MN}$ scans from the first $S_{MN}$ to a first ending point $E_{MN}$, here $E_{MN}$ represents the first ending point for the e-beam column $330_{MN}$. In the present embodiment, the first ending point $E_{MN}$ is at right before the respective first starting point $S_{M(N+1)}$. The e-beam column $330_{MN}$ may scan in a raster mode, vector mode, or other proper mode. In the present embodiment, the exposing process is implemented by moving the wafer 310 (by a wafer stage) relatively to the e-beam column $330_{MN}$, along an opposite direction of the arrow direction. For the sake of simplicity and clarity, the direction pointed by the arrow in FIG. 5A is used to represent a relative movement between the e-beam column $330_{MN}$ and the wafer 310. Therefore, each of e-beam columns $330_{MN}$ scans a same length, which is equal to about D/N.

As an example, as shown in FIG. 5A, the e-beam column $330_{11}$ scans from the first starting point $S_{11}$ to the first ending point $E_{11}$, which is at right before the first starting point $S_{12}$; the e-beam column $330_{12}$ scans from the first starting point $S_{12}$ to the first ending point $E_{12}$; the e-beam column $330_{21}$ scans from the first starting point $S_{21}$ to the first ending point $E_{21}$, which is at right before the first starting point $S_{22}$; the e-beam column $330_{22}$ scans from the first starting point $S_{22}$ to the first ending point $E_{22}$; and so forth. Therefore, e-beam columns of $330_{12}$, $330_{22}$, $330_{21}$ and $330_{22}$ scan a same length, which is equal to about D/2.

Figure 5B:
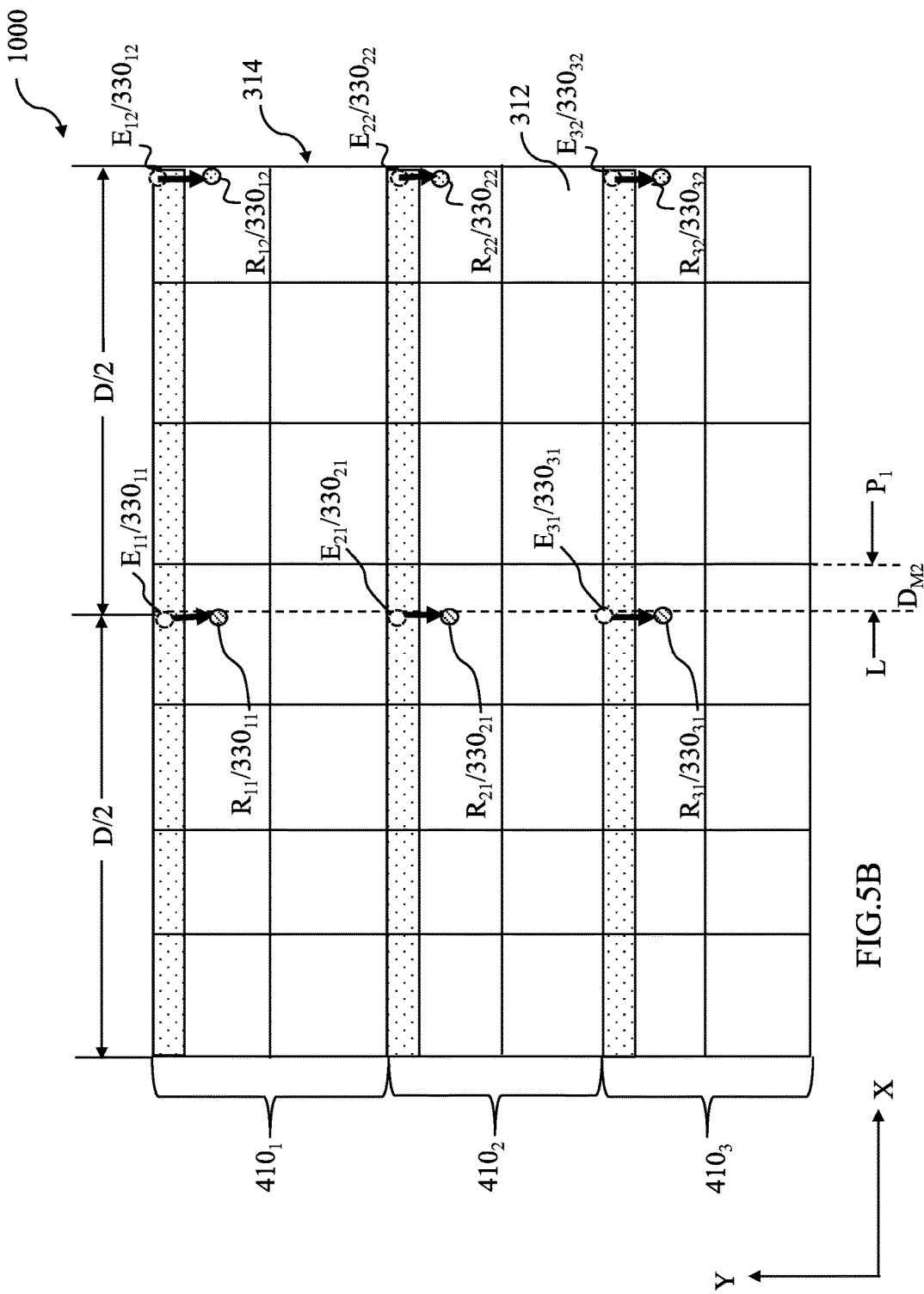

Referring to FIGS. 2 and 5B, for the path A, the method 200 proceeds to step 210A by performing a first movement to move the e-beam column $330_{MN}$ (by moving the wafer 310) from the first ending point $E_{MN}$ to a second starting point $R_{MN}$ such that the second starting point $R_{MN}$ has a same X value as the first ending point $E_{NM}$ but a different Y value, which is towards to next scan area (in FIG. 5B, areas in shadow represent being scanned areas in the field matrix 314). For an example, as shown in FIG. 5B, the e-beam $330_{11}$ moves from the first ending point $E_{11}$ down to the second starting point $R_{11}$; the e-beam $330_{12}$ moves from the first ending point $E_{12}$ down to the second starting point $R_{12}$; and so forth.

Figure 5C:
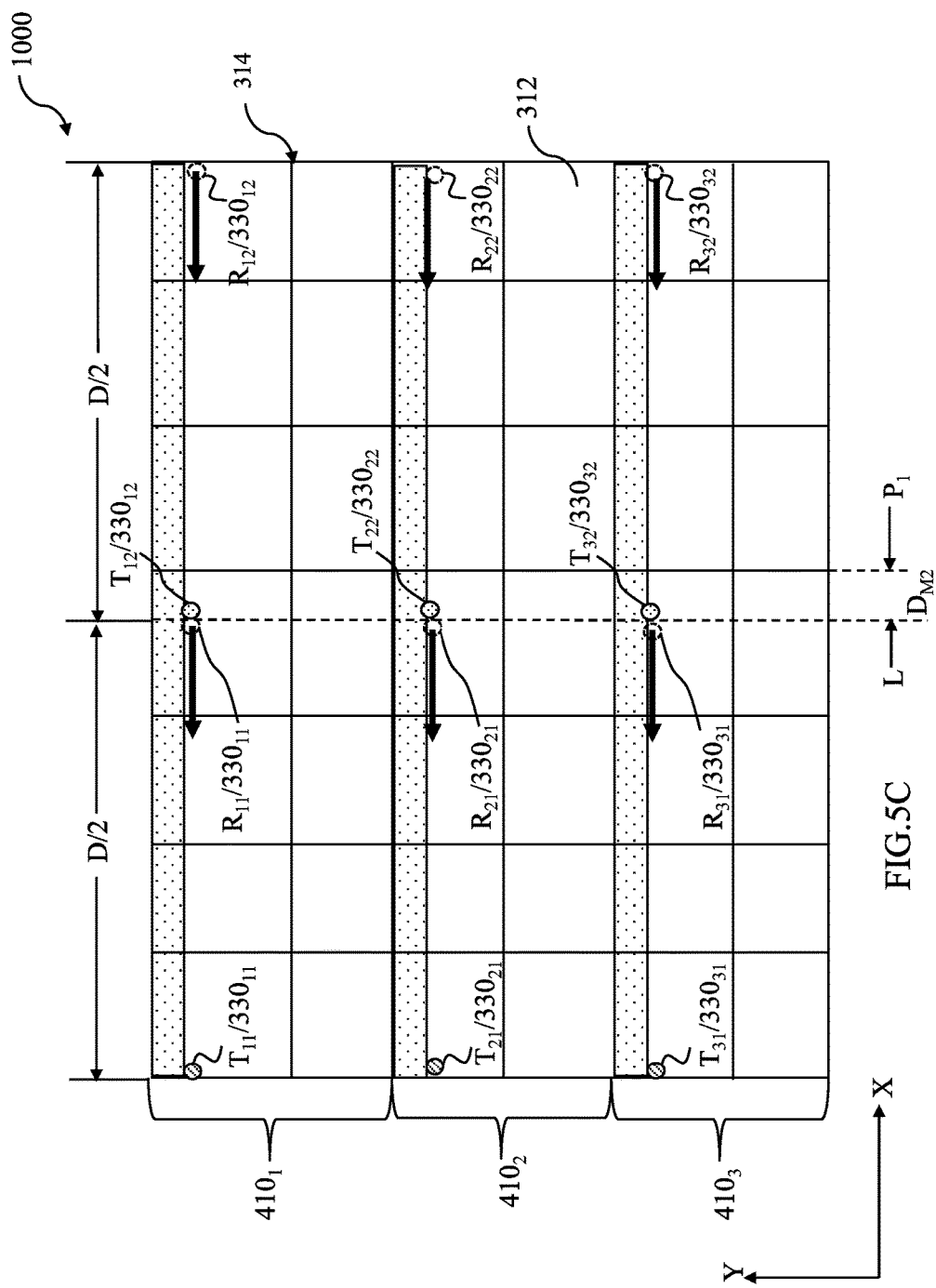

Referring to FIGS. 2 and 5C, for the path A, the method 200 proceeds to step 212A by performing a second exposing process in a scan mode to the field matrix 314 by each of e-beam column $330_{MN}$ along X-direction backwards (as shown in arrow in FIG. 5C) to a respective second ending point $T_{MN}$, here $T_{MN}$ represents the second ending point for the e-beam column $330_{MN}$. In some embodiment, the second ending point $T_{MN}$ has a same X value as the first starting point $S_{MN}$ but a different Y value. The e-beam column $330_{MN}$ may scan in a raster mode, vector mode, or other proper mode. In the present embodiment, the second exposure scanning is implemented by moving the wafer 310 (by a wafer stage) relatively to the e-beam column $330_{MN}$, along an opposite direction of the arrow's direction. For the sake of simplicity and clarity, the direction pointed by the arrow is used to represent a relative movement between the e-beam column $330_{MN}$ and the wafer 310. Therefore, each e-beam column $330_{MN}$ scans (with exposure) a same length of exposure scanning, which is equal to about D/N.

As an example, as shown in FIG. 5C, the $330_{11}$ scans from the second starting point $R_{11}$ to the second ending point $T_{11}$; the $330_{12}$ scans (with exposure) from the second starting point $R_{12}$ to the second ending point $T_{12}$; the $330_{21}$ scans (with exposure) from the second starting point $R_{21}$ to the second ending point $T_{21}$ and the $330_{22}$ scans (with exposure) from the second starting point $R_{22}$ to the second ending point $T_{22}$. Each e-beam column $330_{MN}$ scans (with exposure) a same length of exposure scanning, which is equal to about D/2.

Figure 5D:
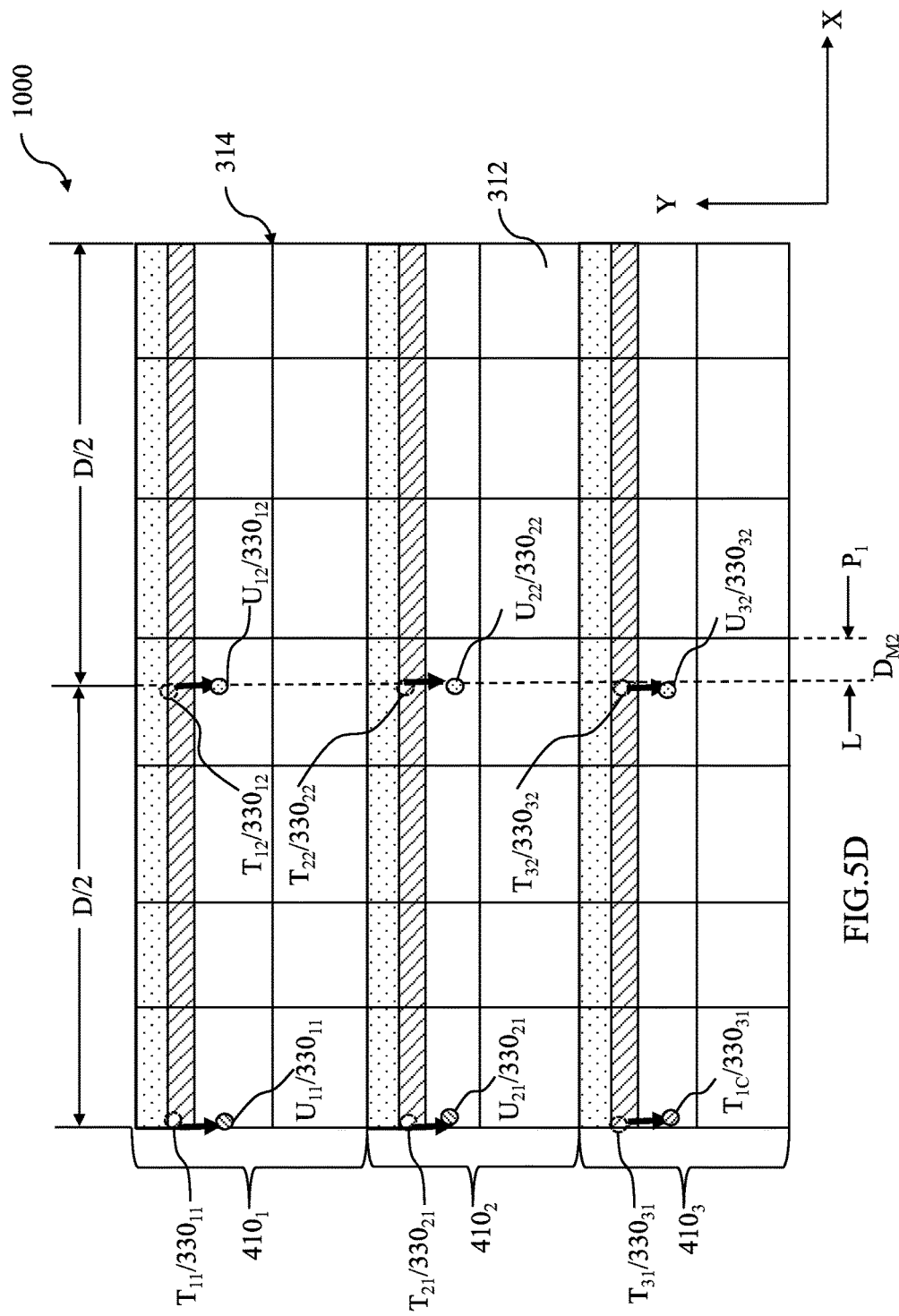

Referring to FIGS. 2 and 5D, for the path A, the method 200 proceeds to step 214A by performing a second movement to move the e-beam column $330_{MN}$ from the second ending point $T_{MN}$ to a third starting point $U_{MN}$ such that the third starting point $U_{MN}$ has a same X value as the respective second ending point $T_{NM}$ and one value different along the Y-direction, towards to next scan area (in FIG. 5D, areas in shadow represent being scanned (with exposure) areas in the field matrix 314). For example, as shown in FIG. 5D, the e-beam $330_{12}$ moves from the second ending point $T_{12}$ down to the third starting point $U_{12}$, the e-beam $330_{22}$ moves from the second ending point $T_{22}$ down to the third starting point $U_{22}$; and so forth.

For path A, steps 208A-214A can be repeated multiple times until the whole field matrix 314 is scanned and exposed by the e-beam column $330_{MN}$.

Figure 6A:
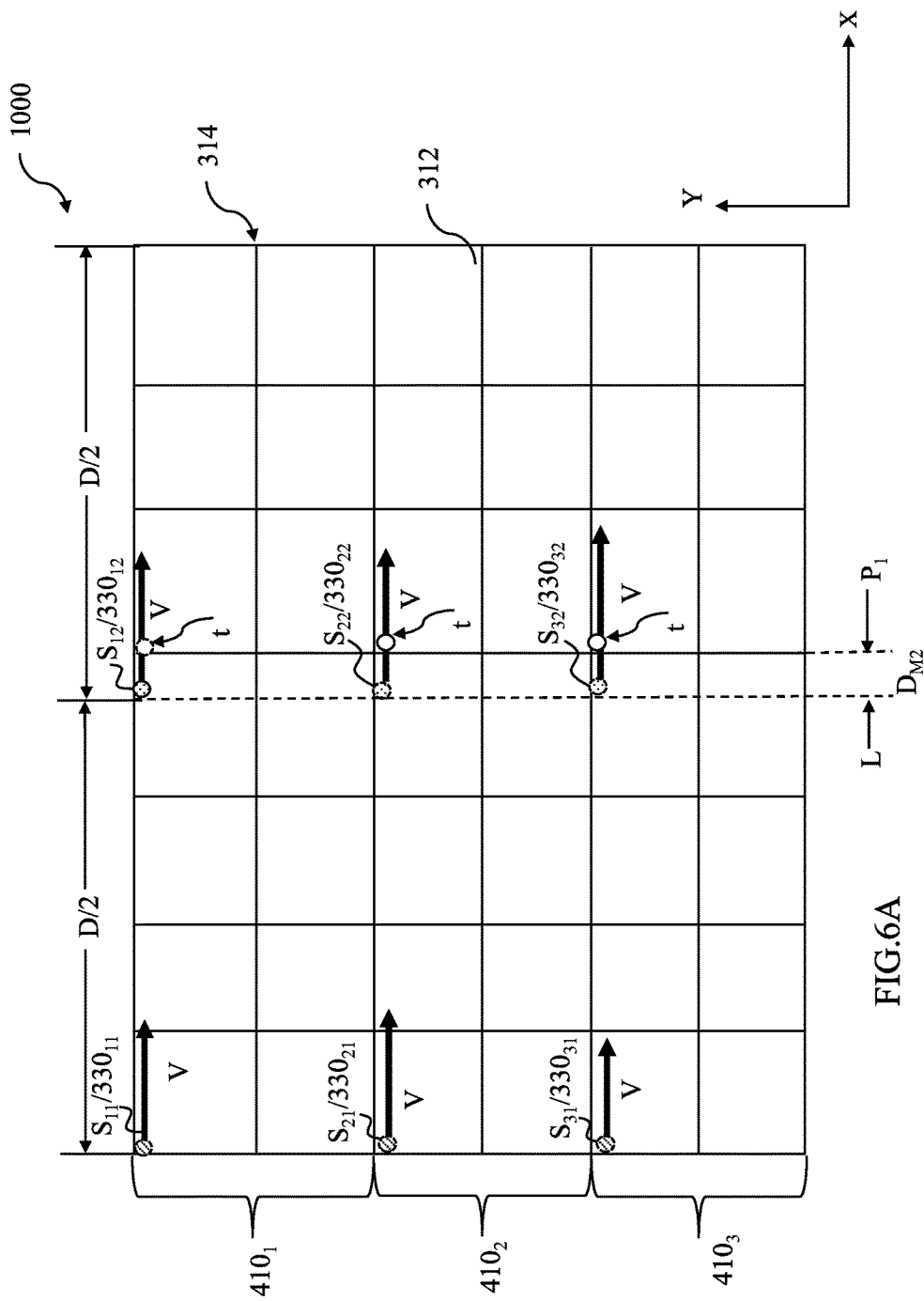
Figure 6B:
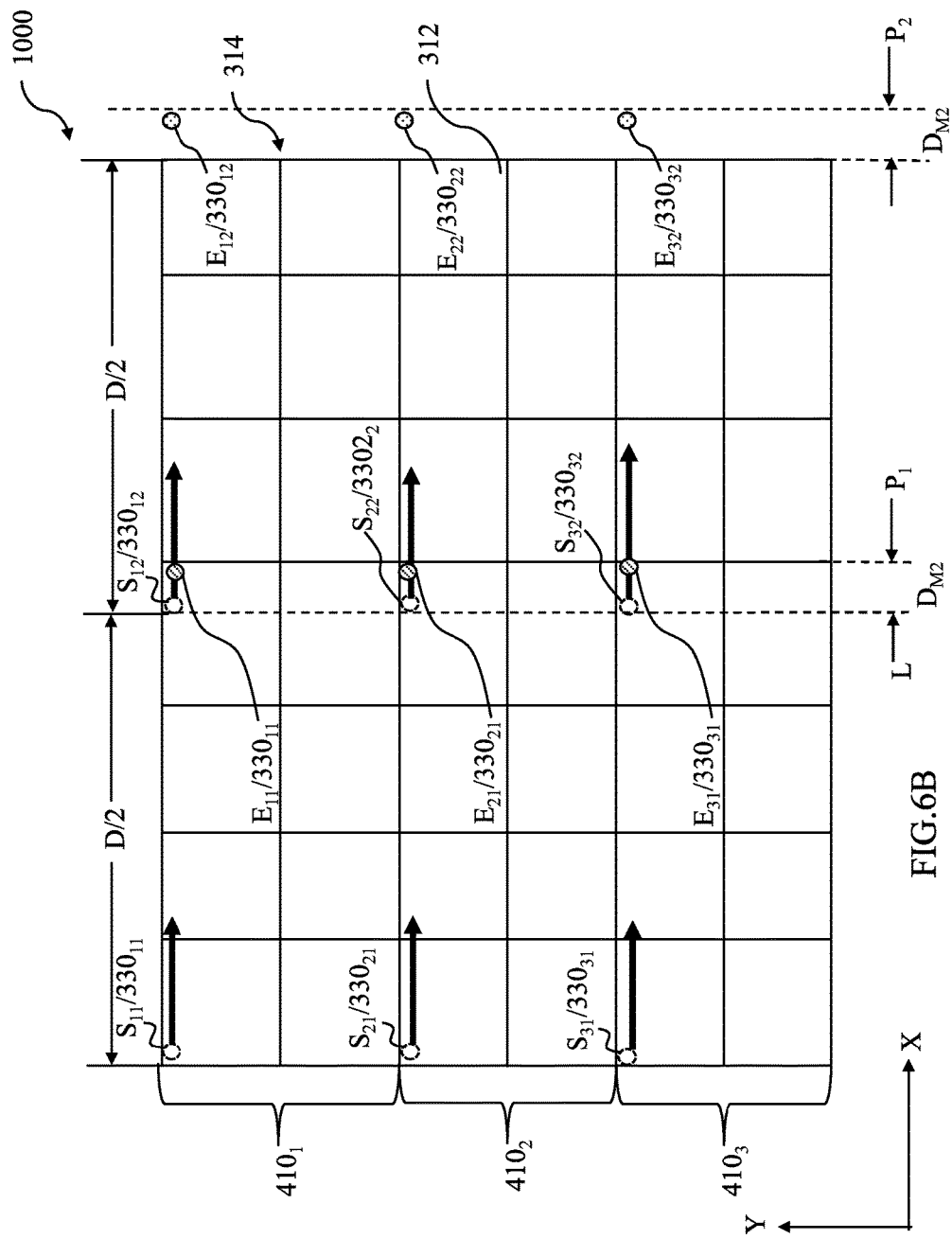

Referring to FIGS. 2 and 6A-6B, for the path B, where the $D_{MN}$ is not zero, the method 200 proceeds to step 208B by performing a first exposing process in the scan mode to the field matrix 314 by each of e-beam column $330_{MN}$ along X-direction (as shown in arrow in FIG. 6A), with an individual turn-on time for the e-beam column $330_{MN}$. In the present embodiment, the e-beam column $330_{MN}$ (N is not equal to 1) is turned on with a delay time $t_{MN}$, which is equal to $D_{MN}/v$, where v is speed of scanning. Therefore, each e-beam column $330_{MN}$ is turned on at a similar locations of the corresponding fields 312, e.g., at an edge of the field 312, and thus a same data sent from the IC database (such as IC database 130 described above with reference to FIG. 1) can be used by each of e-beam column $330_{MN}$ in a same section M, which reduces data bank size and data processing time. As an example, as shown in FIG. 6A, the e-beam columns of $330_{12}$, $330_{22}$ and $330_{32}$ (represent by a shaded circle) are turned on with the delay time $t_{M2}=(D_{M2}/v)$.

Referring to FIG. 6B, the e-beam column $330_{MN}$ scans from the first starting point $S_{MN}$ to the first ending point $E_{MN}$. In the present embodiment, all of the e-beam columns $330_{MN}$ scans simultaneously from the first starting point $S_{MN}$ to the first ending point $E_{MN}$. Therefore, each e-beam column $330_{MN}$ scans a same length, which is about $\{(D/N)+D_{MN}\}$. For example, the scanning length is equal to $\{(D/2)+D_{M2}\}$ for e-beam columns of $330_{11}$, $330_{12}$, $330_{21}$, $330_{22}$, $330_{31}$ and $330_{32}$. In this case, e-beam columns of $330_{11}$, $330_{21}$ and $330_{31}$ scan to the line $P_1$ while e-beam columns of $330_{21}$, $330_{22}$ and $330_{32}$ scan to a line $P_2$.

Referring to FIGS. 2 and 6C, for the path B, the method 200 proceeds to step 210B by performing the first movement to move the e-beam column $330_{MN}$ from the first ending point $E_{MN}$ to the second starting point $R_{MN}$. The movement is similar in many respects to those discussed above in step 210A association with FIG. 5B.

Figure 6D:
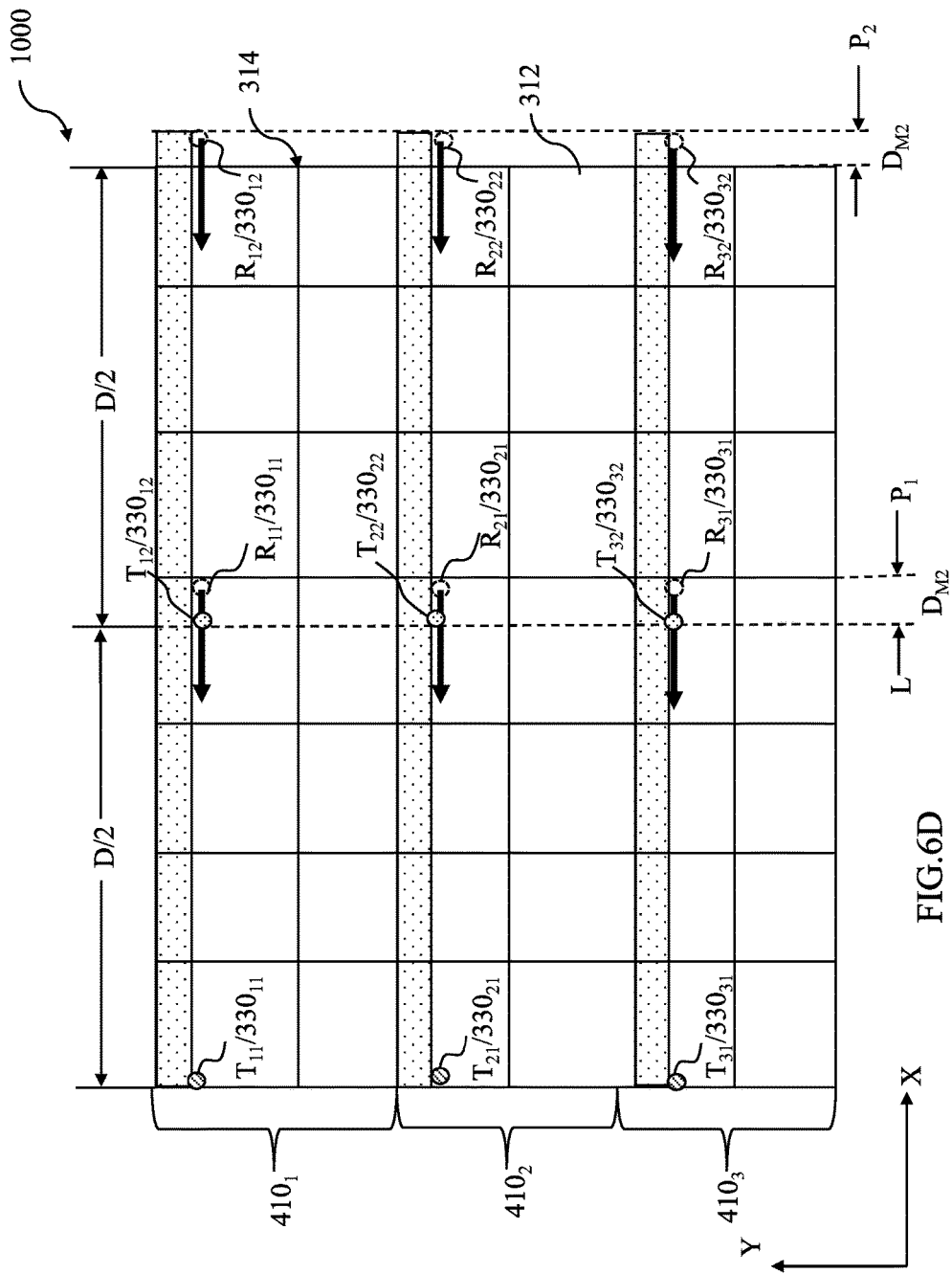

Referring to FIGS. 2 and 6D, for the path B, the method 200 proceeds to step 212B by performing the second exposing process in a scan mode to scan back the field matrix 314 by each of e-beam column $330_{MN}$ along X-direction (as shown in arrow in FIG. 6D) to the respective second ending point $T_{MN}$. The second scan is similar in many respects to those discussed above in step 212A association with FIG. 5C, except the e-beam column $330_{MN}$ is turned off individually. The e-beam $330_{MN}$ (except $330_{M1}$) is turned off when it reaches the second starting point $R_{M1}$ of the e-beam column $330_{M1}$. As an example, as shown in FIG. 6D, the e-beam columns $330_{12}$, $330_{22}$ and $330_{32}$ are turned off at the second starting points $R_{11}$, $R_{21}$ and $R_{31}$ (at the line $P_1$).

Figure 6E:
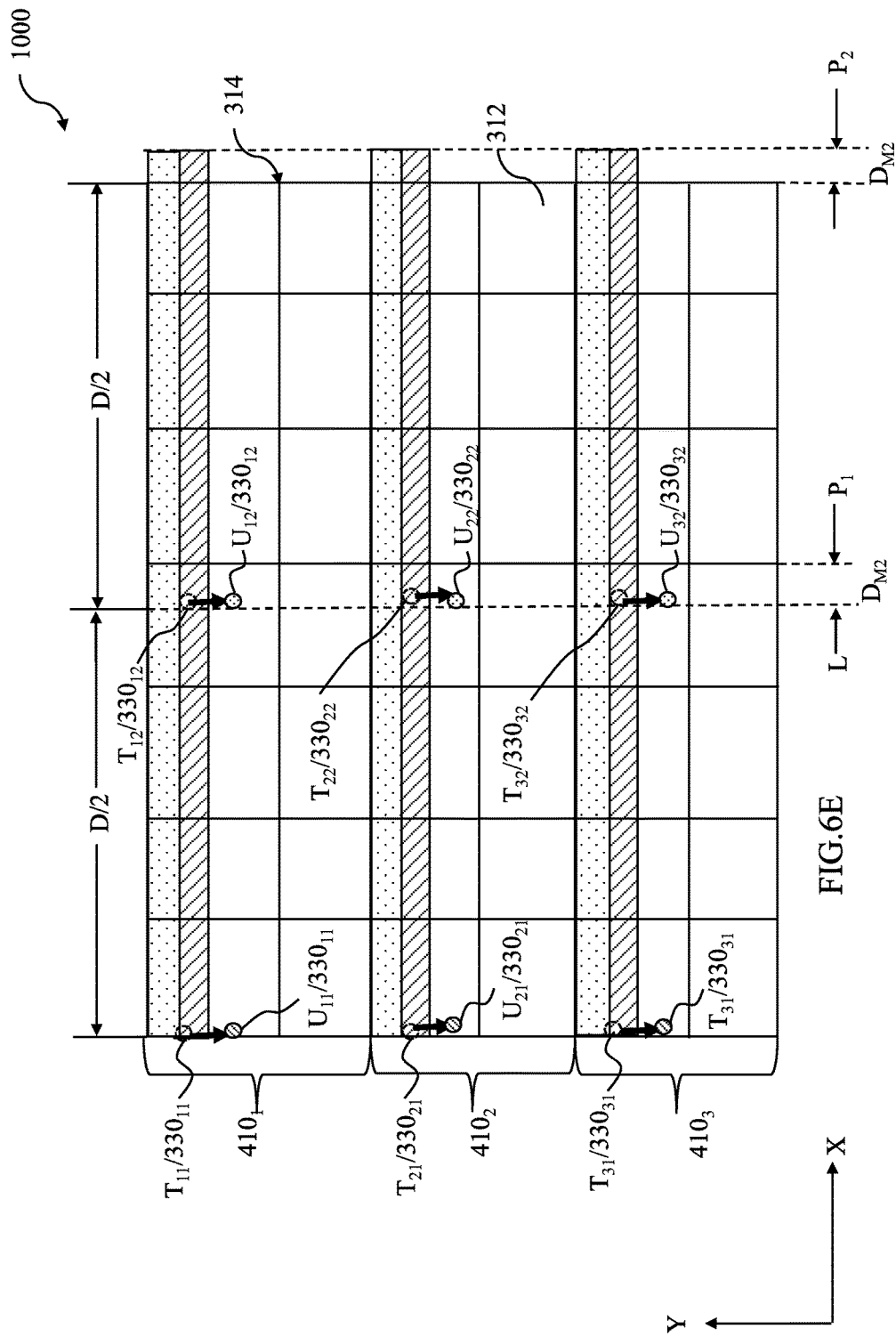

Referring to FIGS. 2 and 6E, for the path B, the method 200 proceeds to step 214B by performing a second movement to move the e-beam column $330_{MN}$ from the second ending point $T_{NM}$ to the third starting point $U_{NM}$. The second movement is similar in many respects to those discussed above in step 214A association with FIG. 5D.

For path B, steps 208B-214B can be repeated multiple times until the whole field matrix 314 is scanned and exposed by the e-beam column $330_{MN}$.

Figure 7A:
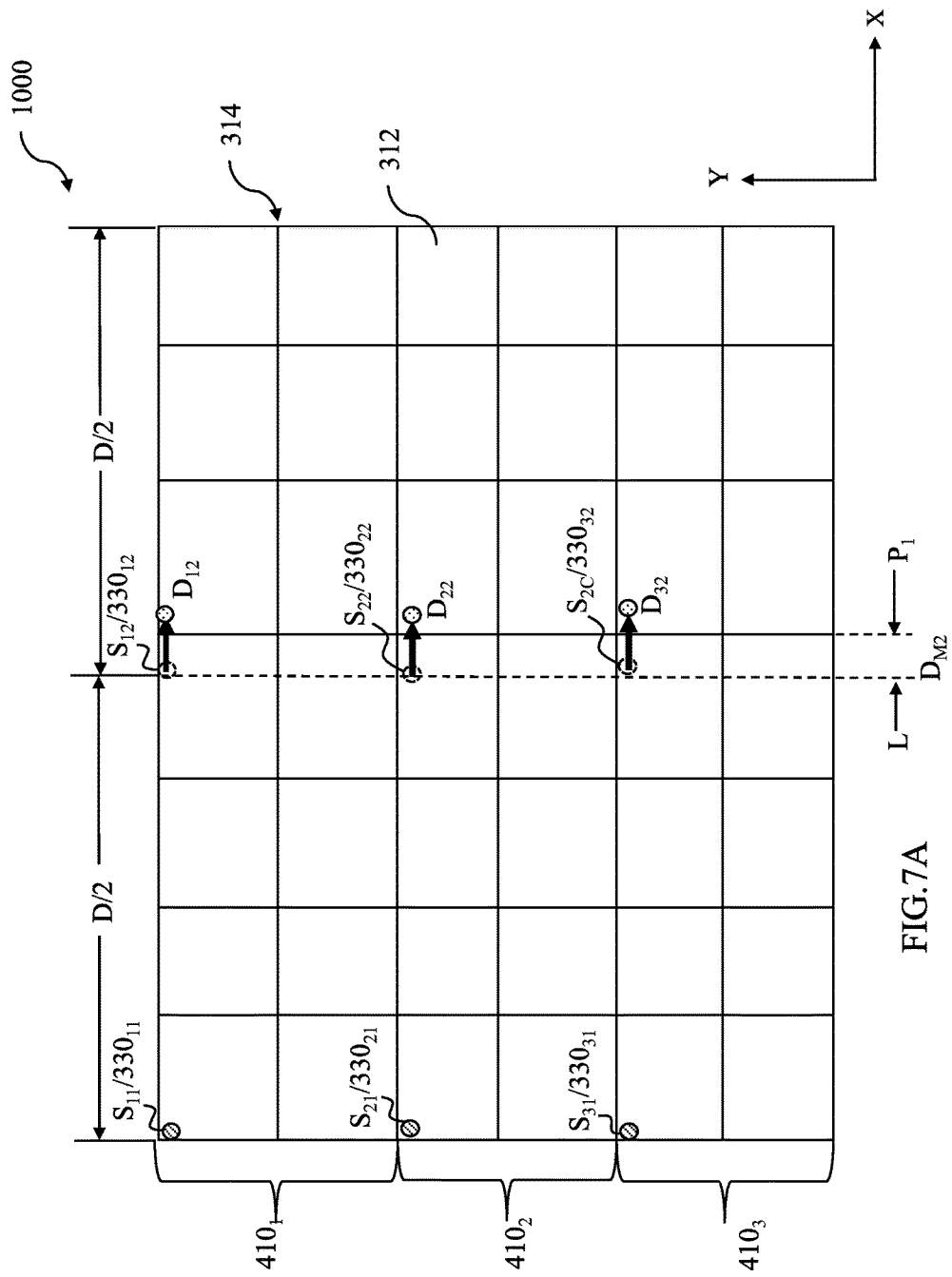

Referring to FIGS. 2 and 7A, for the path C, where the $D_{MN}$ is not zero, the method 200 proceeds to step 208C by performing a deflecting process, thereby shifting individually e-beams of the e-beam columns $330_{MN}$ forward along the X-direction on the field matrix 314 by $D_{MN}$, such that the e-beams of the e-beam columns $330_{MN}$ in the section M are directed to similar locations of the corresponding fields 312. The deflecting process may be performed by a deflector, such as the deflector 106 in FIG. 1. As an example, as shown in FIG. 7A, the e-beams of the e-beam columns $330_{12}$, $330_{22}$, and $330_{32}$ are deflected forward along X-direction by $D_{M2}$, from the line L to the line $P_1$.

Figure 7B:
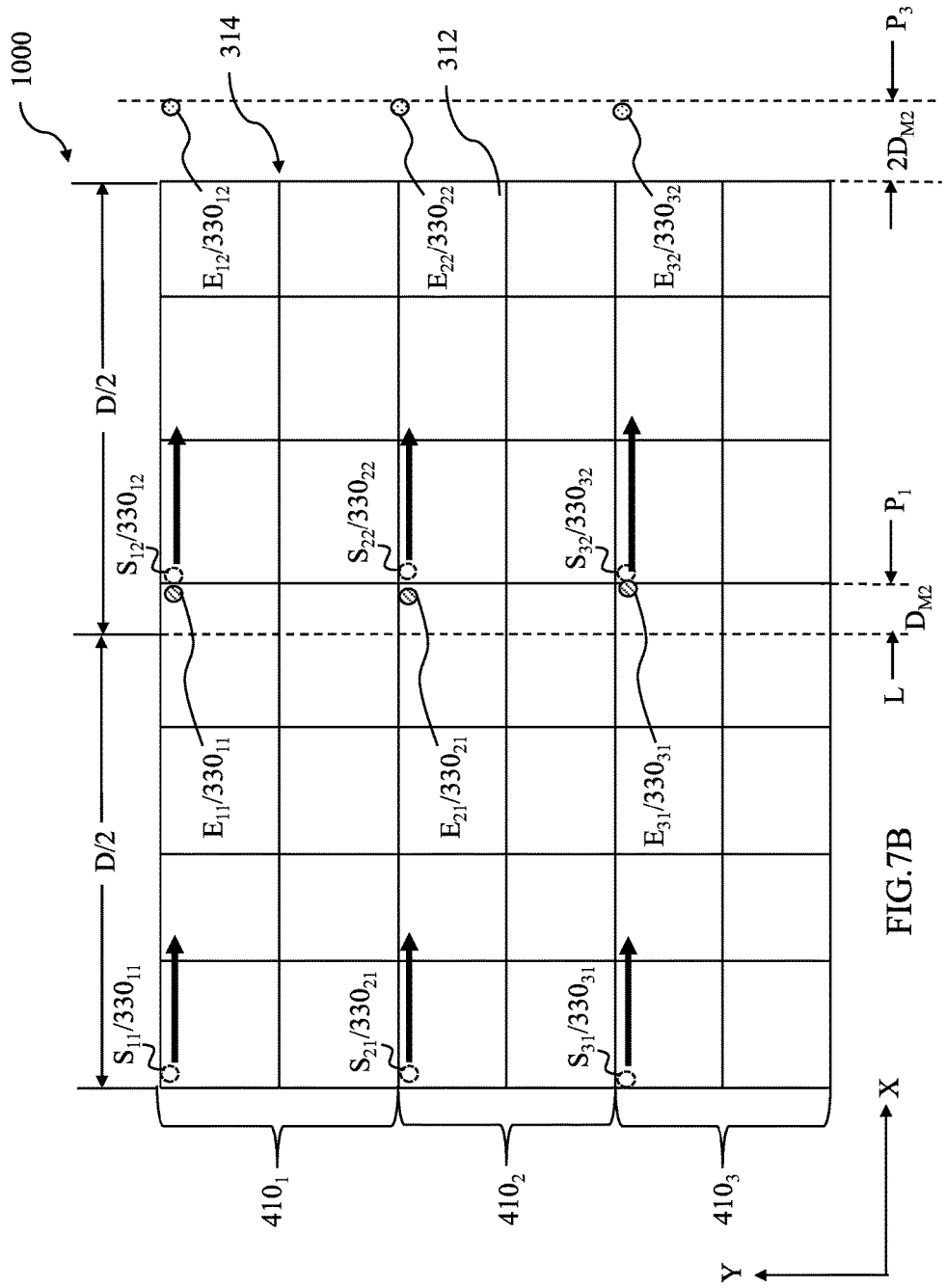

Referring to FIGS. 2 and 7B, for the path C, the method 200 proceeds to step 210C by performing the first exposing process in the scan mode to the field matrix 314 by each of e-beam column $330_{MN}$ along X-direction (as shown in arrow in FIG. 7B) from the first starting point $S_{MN}$ to the first ending point $E_{MN}$. The exposing process is similar in many respects to those discussed above in step 208A association with FIG. 5A. Each e-beam column $330_{MN}$ scans a same scan length, which is about $\{(D/N)+D_{MN}\}$. For example, as shown in FIG. 7B, the scanning length is equal to $\{(D/2)+D_{M2}\}$ for e-beam columns of $330_{11}$, $330_{12}$, $330_{21}$, $330_{22}$, $330_{31}$ and $330_{32}$. In this case, e-beam columns of $330_{11}$, $330_{21}$ and $330_{31}$ scan to the line $P_1$ while e-bean columns of $330_{21}$, $330_{22}$ and $330_{32}$ scan to a line $P_3$. By deflecting the e-beams of the e-beam column $330_{MN}$ to similar locations of the corresponding fields 312, a same data sent from the IC database (such as IC database 130 described above with reference to FIG. 1) can be used by each of e-beam column $330_{MN}$ in a same section M, which reduces data bank size and data processing time.

Figure 7C:
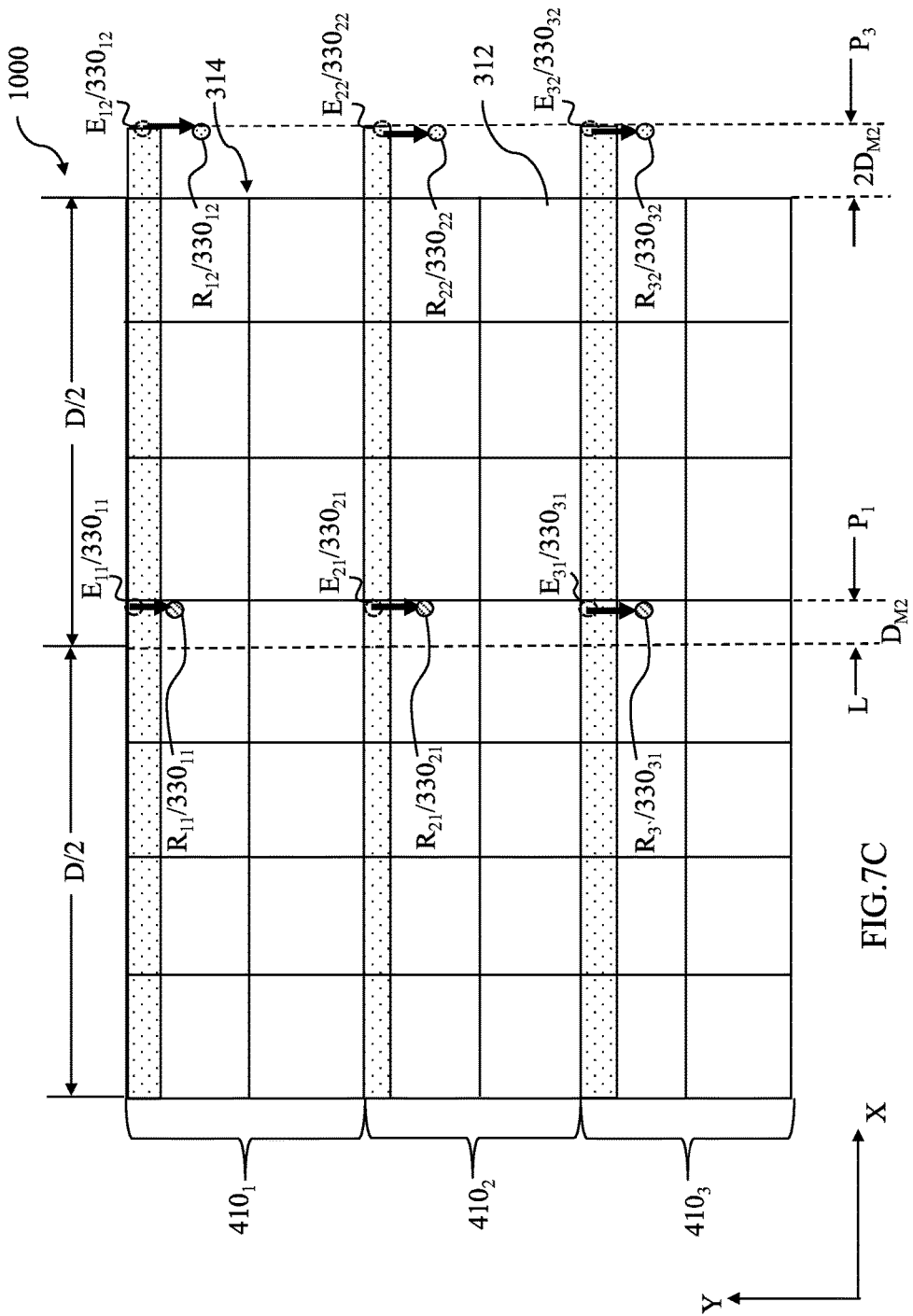

Referring to FIGS. 2 and 7C, for the path C, the method 200 proceeds to step 212C by performing the first movement to move the e-beam column $330_{MN}$ from the first ending point $E_{NM}$ to the second starting point $R_{NM}$. The movement is similar in many respects to those discussed above in step 210A association with FIG. 5B.

Figure 7D:
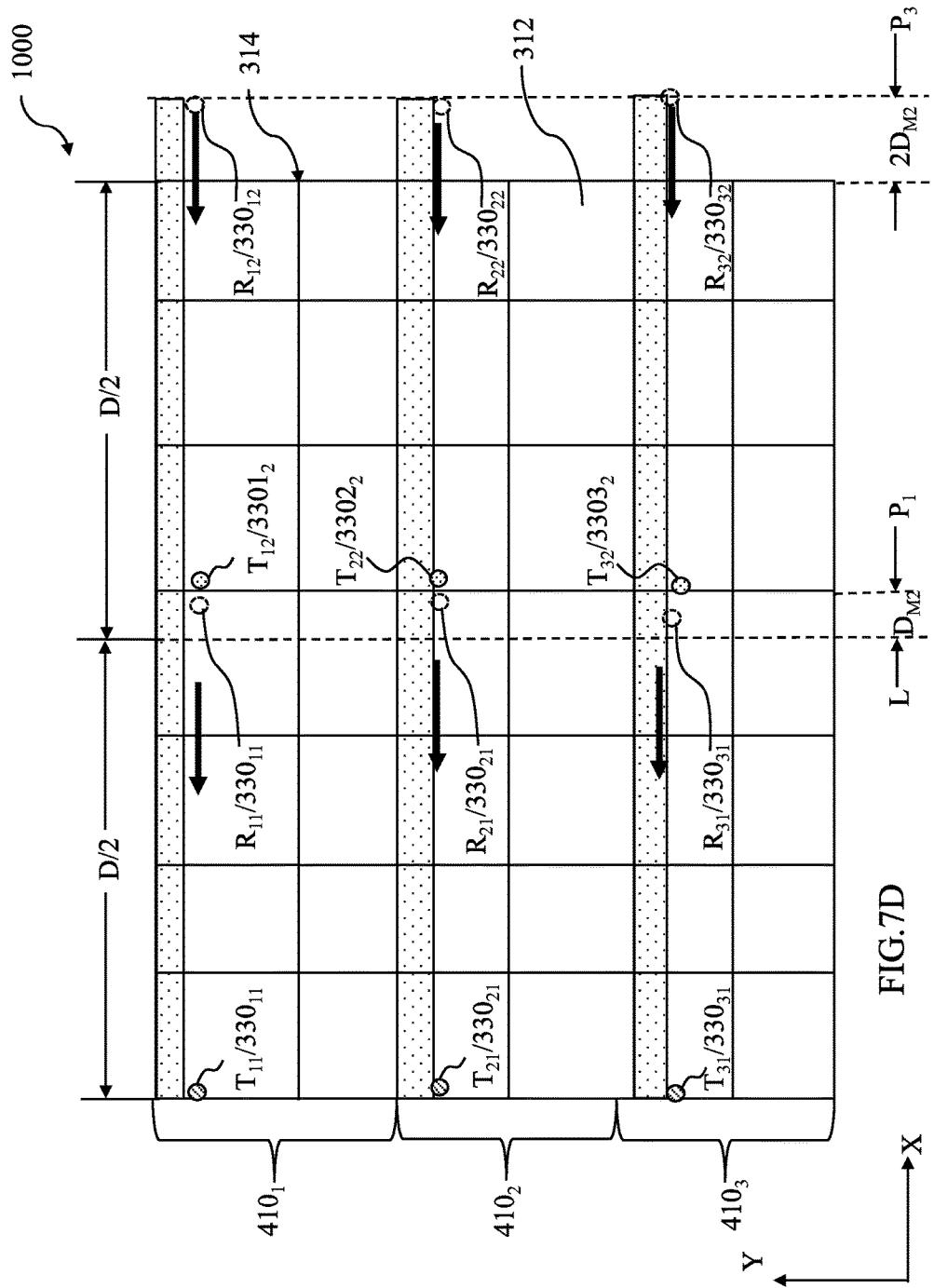

Referring to FIGS. 2 and 7D, for the path C, the method 200 proceeds to step 214C by performing the second exposing process scanning backward to the field matrix 314 simultaneously by each of e-beam column $330_{MN}$, along X-direction (as shown in arrow in FIG. 7D), to the second ending point $T_{NM}$. The second exposure scanning is similar in many respects to those discussed above in step 212A association with FIG. 5C.

Figure 7E:
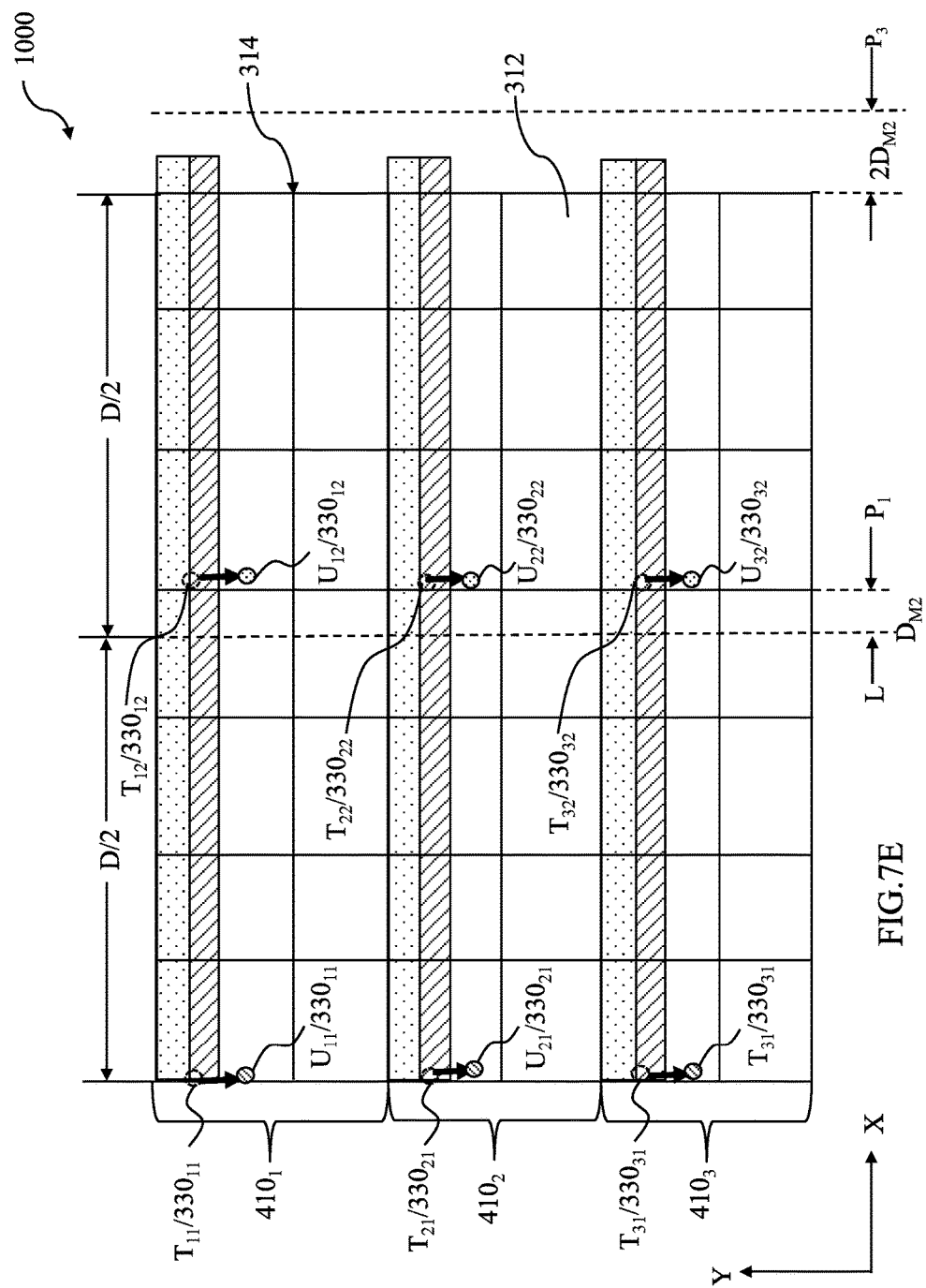

Referring to FIGS. 2 and 7E, for the path C, the method 200 proceeds to step 216C by performing a second movement to move the e-beam column $330_{MN}$ from the second ending point $T_{NM}$ to the third starting point $U_{NM}$. The second movement is similar in many respects to those discussed above in step 214A association with FIG. 5D.

For path C, steps 208C-216C can be repeated multiple times until the whole field matrix 314 is scanned and exposed by the e-beam column $330_{MN}$.

Additional steps can be provided before, during, and after the method 200, and some of the steps described can be repeated, replaced, eliminated, or moved around for additional embodiments of the method 200. For example, the deflecting process and exposure turning-on delay may be performed together in the positioning and the exposing processes, such that the e-beam columns $330_{MN}$ is shifted individually along the X-direction on the field matrix 314 by a distance $D_{MN}$ and turned on with a delay time $t_{MN}$. Thus each e-beam column $330_{MN}$ is turned on at similar locations of the corresponding fields 312. Therefor each e-beam column $330_{MN}$ scans a same scan length, which is about $[D/N+D_{MN}+(v \times t_{MN})]$.

Based on the above, the present disclosure offers a method of e-beam lithography process. The method employs positioning e-beam columns arrayed a scan direction and equipping with deflecting process and exposure time delay process. The method demonstrates scan length reduction, data bank reduction and throughput improvement.

Thus, the present disclosure provides a method for a lithography process. The method includes loading a substrate to an electron-beam (e-beam) system such that a first subset of fields defined on the substrate is arrayed on the substrate along a first direction. The method also includes positioning a plurality of e-beam columns having a first subset of e-beam columns arrayed along the first direction.

The e-beam columns of the first subset of e-beam columns are directed to different ones of the first subset of fields. The method also includes performing a first exposing process in a scan mode such that the plurality of e-beam columns scans the substrate along the first direction.

In another embodiment, the method includes loading a substrate to an electron-beam (e-beam) system such that a first subset of fields defined on the substrate is arrayed on the substrate along a first direction. The method also includes positioning an e-beam module having a first subset of e-beam columns arrayed along the first direction such that e-beams from the first subset of e-beam columns are directed to different ones of the first subset of fields. The method also includes performing a first exposing process in a scan mode such that the plurality of e-beam columns turn on exposing at similar locations of the corresponding fields and scan the substrate along the first direction.

In yet another embodiment, the method includes loading a substrate to an electron-beam (e-beam) system such that a first subset of fields defined on the substrate is arrayed on the substrate along a first direction. The method also includes positioning an e-beam system having a first e-beam column and a second e-beam column arrayed the first subset of fields along the first direction. The first e-beam column is directed to a field at an end of the substrate and the second e-beam column is directed to a field at half way of the substrate. The method also includes performing a first exposing process in a scan mode such that the first e-beam column and the second e-beam column scan the substrate along the first direction from a respective first starting point to a respective first ending point, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    loading a substrate to an electron-beam (e-beam) system, wherein the substrate has an associated field matrix having at least two sections defined along a first direction that is perpendicular to a second direction, the second direction being an e-beam scan direction;
    positioning a pair of e-beam columns in each of the at least two sections, wherein each e-beam column of the pair is responsible for scanning a different subset of fields belonging to a respective section; and
    performing a first exposing process in a scan mode such that the pair of e-beam columns scan the substrate along the second direction.

2. The method of claim 1, wherein positioning the pair of e-beam columns includes performing a deflecting process to shift one of the e-beam columns of the pair along the second direction on the substrate such that each of the e-beam columns of the pair scan similar locations of corresponding fields.

3. The method of claim 2, wherein each e-beam column in the pair uses a same data set.

4. The method of claim 1, wherein the performing of the first exposing process in the scan mode further includes turning on one of the e-beam columns of the pair with a time delay, such that each of the e-beam columns of the pair scan similar locations of corresponding fields.

5. The method of claim 4, wherein each e-beam column in the pair uses a same data set.

6. The method of claim 1, wherein each e-beam column of the pair scans about half a diameter of the substrate during the first exposing process.

7. The method of claim 1, further comprising:
    after the first exposing process, wherein each e-beam column of the pair scans from a first starting point to a first ending point, moving the pair of e-beam columns along the first direction from the first ending point to a second starting point, wherein the second starting point aligns with the first ending point along the first direction; and
    performing a second exposing process in a scan mode, such that each e-beam column of the pair scans the substrate backwards along the second direction from the second starting point to a second ending point, wherein the second ending point aligns with the first starting point along the first direction.

8. A method comprising:
    loading a substrate to an electron-beam (e-beam) system, wherein the substrate has an associated field matrix having at least two sections defined along a first direction that is perpendicular to a second direction, the second direction being an e-beam scan direction, and further wherein the substrate has a diameter;
    for each of the at least two sections, positioning a pair of e-beam columns in the section, wherein each e-beam column pair is responsible for scanning a different subset of fields of the section along the second direction, and further wherein the e-beam columns of the pair are spaced apart by about half the diameter of the substrate; and
    performing a first exposing process in a scan mode, such that the pair of e-beam columns scans the substrate along the second direction, wherein the first exposing process delays turning on one of the e-beam columns of the pair to ensure that the pair of e-beam columns scan similar locations of corresponding fields.

9. The method of claim 8, wherein each of the e-beam columns of the pair uses a same data set.

10. The method of claim 8, wherein the one of the e-beam columns of the pair is turned on when the one of the e-beam columns is positioned at an edge of a field.

11. The method of claim 8, further comprising:
    before performing the first exposing process, performing a deflecting process to shift the one of the e-beam columns of the pair along the second direction a distance d on the substrate, such that each of the e-beam columns of the pair scan similar locations of corresponding fields.

12. The method of claim 11, wherein each e-beam column in the pair scans a same length along the second direction, wherein the length is represented by (D/2+d), where D is the diameter of the substrate.

13. The method of claim 8, wherein each e-beam column in the pair scans a same length along the second direction, wherein the length is represented by [D/2+(V×t)], where D is the diameter of the substrate, V is a scanning speed, and t is a delay time for turning on the one of the e-beam columns of the pair.

14. The method of claim 8, further comprising:

after the first exposing process, wherein each e-beam column of the pair scans from a first starting point to a first ending point, moving the pair of e-beam columns along the first direction from the first ending point to a second starting point, wherein the second starting point aligns with the first ending point along the first direction; and performing a second exposing process in a scan mode, such that each e-beam column of the pair scans the substrate backwards along the second direction from the second starting point to a second ending point, wherein the second ending point aligns with the first starting point along the first direction.

15. A method comprising:

loading a substrate to an electron-beam (e-beam) system, wherein the substrate has an associated field matrix having sections defined along a y-direction, and further wherein the e-beam system scans in the x-direction;

positioning an e-beam system, such that each section defined along the y-direction includes a first e-beam column and a second e-beam column positioned to scan along the x-direction; and performing a first exposing process in a scan mode, such that the first e-beam column and the second e-beam column together scan a width of the substrate defined in the x-direction during the first exposing process, the first e-beam column and the second-beam column each having a respective first starting point and a respective first ending point.

16. The method of claim 15, wherein positioning the e-beam system further includes performing a deflecting process to shift the second e-beam column along the x-direction on the substrate, such that the first e-beam column and the second e-beam column scan similar locations of corresponding fields, wherein the first e-beam column and the second e-beam column use a same data set.

17. The method of claim 16, wherein the first e-beam column and the second e-beam column are spaced apart by about half the width of the substrate, and further wherein the first e-beam column and the second e-beam column scan a same length along the x-direction, wherein the length is about $(D/2+d)$, where D is the width of the substrate and d is a distance the second e-beam column is shifted by the deflecting process.

18. The method of claim 15, wherein performing the first exposing process in the scan mode further includes turning on the second e-beam column with a time delay with respect to when the first e-beam column is turned on, such that the first e-beam column and the second e-beam column scan similar locations of corresponding fields, wherein the first e-beam column and the second e-beam column use a same data set.

19. The method of claim 18, wherein the first e-beam column and the second e-beam column are spaced apart by about half the width of the substrate, and further wherein the first e-beam column and the second e-beam column scan a same length along the x-direction, wherein the length is about $[D/2+(V \times t)]$, where D is the width of the substrate, V is a scanning speed, and t is the time delay.

20. The method of claim 15, further comprising:

after performing the first exposing process, moving the first e-beam column and the second e-beam column along the y-direction from the first ending point to a second starting point, wherein the second starting point aligns with the first ending point in the y-direction; and performing a second exposing process in a scan mode, such that the first e-beam column and the second e-beam column scan the substrate backwards along the x-direction, from the second starting point to a second end point, wherein the second ending point aligns with the first starting point in the y-direction.

\* \* \* \* \*